(12) United States Patent
Ikura

(10) Patent No.: US 11,469,316 B2
(45) Date of Patent: Oct. 11, 2022

(54) SEMICONDUCTOR DEVICE

(71) Applicant: FUJI ELECTRIC CO., LTD., Kawasaki (JP)

(72) Inventor: Yoshihiro Ikura, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 98 days.

(21) Appl. No.: 16/854,806

(22) Filed: Apr. 21, 2020

(65) Prior Publication Data

US 2020/0403089 A1  Dec. 24, 2020

(30) Foreign Application Priority Data

Jun. 24, 2019  (JP) .............................. JP2019-116483

(51) Int. Cl.
*H01L 29/739* (2006.01)
*H01L 29/10* (2006.01)
*H01L 29/423* (2006.01)

(52) U.S. Cl.
CPC ...... *H01L 29/7397* (2013.01); *H01L 29/1095* (2013.01); *H01L 29/4236* (2013.01); *H01L 29/4238* (2013.01)

(58) Field of Classification Search
CPC ............. H01L 29/7397; H01L 29/1095; H01L 29/4238; H01L 29/4236; H01L 29/407
See application file for complete search history.

(56) References Cited

U.S. PATENT DOCUMENTS

| | | | |
|---|---|---|---|
| 2005/0161768 A1* | 7/2005 | Sugiyama | H01L 29/7397 257/E29.198 |
| 2010/0327313 A1* | 12/2010 | Nakamura | H01L 29/0834 257/133 |
| 2015/0008479 A1* | 1/2015 | Kato | H01L 29/1095 438/138 |
| 2015/0129927 A1* | 5/2015 | Sumitomo | H01L 29/4238 257/139 |
| 2015/0311328 A1* | 10/2015 | Takei | H01L 29/1608 257/77 |
| 2018/0047821 A1* | 2/2018 | Iwasaki | H01L 29/1095 |
| 2018/0183433 A1 | 6/2018 | Ojima et al. | |
| 2018/0204910 A1 | 7/2018 | Mitamura | |
| 2019/0088769 A1* | 3/2019 | Matsushita | H01L 29/41708 |

FOREIGN PATENT DOCUMENTS

| | | |
|---|---|---|
| JP | 2013251296 A | 12/2013 |
| JP | 2018107693 A | 7/2018 |
| JP | 2018117025 A | 7/2018 |

* cited by examiner

*Primary Examiner* — Jonathan Han
(74) *Attorney, Agent, or Firm* — Rabin & Berdo, P.C.

(57) ABSTRACT

A semiconductor device includes a collector layer of a first conductive type, a drift layer of a second conductive type, an accumulation region of the second conductive type, a base region of the first conductive type, emitter regions of the second conductive type, a first gate electrode in contact with the emitter regions via first gate insulating film, a second gate electrode facing the first gate electrode via the base region, and being in contact with the emitter regions via second gate insulating film, a first resistive section electrically connected to the first gate electrode, a second resistive section having a larger resistance than does the first resistive section, and electrically connected to the second gate electrode, and a gate electrode pad electrically connected to the first and second resistive sections.

15 Claims, 15 Drawing Sheets

SEMICONDUCTOR DEVICE

CROSS REFERENCE TO RELATED APPLICATION

This application is based upon and claims the benefit of priority of Japanese Patent Application No. 2019-116483, filed on Jun. 24, 2019, the entire disclosure of which is incorporated herein by reference.

FIELD

The present invention relates to a semiconductor device.

BACKGROUND

Various techniques for improving turn-on characteristics and ON-voltage characteristics of insulated gate bipolar transistors (also referred to as IGBTs) are known.

For example, Japanese Unexamined Patent Publications Nos. 2013-251296 and 2018-117025, respectively referred to as patent documents 1 and 2, describe techniques in which gate electrodes are electrically connected to first and second gate trenches via resistors having different resistances, wherein the first gate trenches are in contact with emitter regions, while the second gate trenches are not in contact with emitter regions.

In the technique described in patent document 1, the first gate trenches are electrically connected to normal electrodes via a first resistor, while the second gate trenches are electrically connecting to control electrodes via a second resistor having a smaller resistance than the first resistor. In this technique, the voltage applied to the normal electrodes is changed faster than the voltage applied to the control electrodes, thereby suppressing a surge voltage, at the time of turn-on and turn-off.

In the technique described in patent document 2, the first and second gate trenches are electrically connected to a gate electrode via first and second electrical elements, respectively. These electrical elements are formed such that the time constant of an RC circuit composed of the second electrical element and second gate trenches is larger than that of an RC circuit composed of the first electrical element and first gate trenches. In this technique, the time constant of the RC circuit including the second gate trenches, which are not in contact with the emitter regions, is set larger so that positive holes are accumulated to produce an effect of enhancing electron injection, thereby improving turn-on characteristics and reducing turn-on loss of the switching device.

However, the devices of the techniques described in patent documents 1 and 2 include second gate trenches which are not in contact with the emitter regions; in these trenches, channels are not created and turn-on does not occur. Accordingly, current paths at the time of being turned on are fewer than in a semiconductor device including only the first gate trenches, which may cause the ON voltage to be high.

SUMMARY

Provided is a semiconductor device including a collector layer of a first conductive type, a drift layer of a second conductive type, disposed over the collector layer, an accumulation region of the second conductive type, disposed on the drift layer, a base region of the first conductive type, disposed on the accumulation region, a plurality of emitter regions of the second conductive type, disposed in a surface layer of the base region, a first gate insulating film, a first gate electrode in contact with the emitter regions via the first gate insulating film, a second gate insulating film, a second gate electrode facing the first gate electrode via the base region, and being in contact with the emitter regions via the second gate insulating film, a first resistive section having a first resistance and being electrically connected to the first gate electrode, a second resistive section having a second resistance greater than the first resistance and electrically connected to the second gate electrode, and a gate electrode pad electrically connected to the first and second resistive sections.

In the semiconductor device, the first gate electrode may include a plurality of first gate electrodes, and the second gate electrode may include a plurality of second gate electrodes, and one of the second gate electrodes is disposed between two adjacent first gate electrodes of the plurality of first gate electrodes.

In the semiconductor device, the second gate electrodes may each face a corresponding one of the first gate electrodes via the base region. Further, the first gate electrode may include a plurality of first gate electrodes, and the second gate electrode may include a plurality of second gate electrodes, and one of the first gate electrodes may be disposed between two adjacent second gate electrodes of the plurality of second gate electrodes.

In the semiconductor device, the first gate electrodes may be disposed alternately with the second gate electrodes. Further, the second gate electrodes may each face a corresponding one of the first gate electrodes via the base region.

The semiconductor device may further include an emitter electrode electrically connected to the emitter regions, a first gate wiring surrounding the emitter electrode, and electrically connecting the first gate electrode and the first resistive section, and a second gate wiring surrounding the emitter electrode, and electrically connecting the second gate electrode and the second resistive section.

In the semiconductor device, the gate electrode pad may include a first gate electrode pad electrically connected to the first and second gate wirings via the first and second resistive sections, respectively.

In the semiconductor device, the gate electrode pad further may include a second gate electrode pad disposed between the second resistive section and the second gate wiring.

In the semiconductor device, the emitter electrode may have a rectangular shape with a recess, in a plan view of the semiconductor device, and the first and second resistive sections face the recess, in the plan view.

In the semiconductor device, the emitter electrode may include a first emitter electrode, and a second emitter electrode apart from the first emitter electrode, and the first and second resistive sections are disposed between the first and second emitter electrodes.

The semiconductor device may further includes a third resistive section that is different from the first resistive section. The second resistance may be a combined resistance of the first resistance of the first resistive section and a third resistance of the third resistive section.

BRIEF DESCRIPTION OF DRAWINGS

Other features and advantages of the present invention will be apparent from the ensuing description, taken in conjunction with the accompanying drawings.

FIGS. 10A-10C respectively show changes over time in gate voltages of the semiconductor devices of the first and second comparative examples and the embodiment. FIGS. 10D-10F respectively show changes over time in collector currents of the semiconductor devices of the first and second comparative examples and the embodiment.

DESCRIPTION OF EMBODIMENTS

A preferred embodiment of the semiconductor device will now be described with reference to the accompanying drawings. However, the technical scope of the invention is not limited to this embodiment, and includes the invention described in claims and equivalents thereof.

In the present specification, one and the other sides in a direction parallel to the depth direction of a semiconductor substrate are referred to as "upper" and "lower," respectively. One and the other of two main surfaces of a substrate, layer or other flat members are referred to as upper and lower surfaces, respectively. "Upper" and "lower" do not necessarily indicate the direction of gravity nor the vertical direction at the time of mounting a semiconductor device.

In the following examples, the first and second conductive types are p-type and n-type, respectively, but may be n-type and p-type, respectively. In the latter case, the conductive types of the substrates, layers and regions are opposite to those in the following examples.

In the present specification and the accompanying drawings, "n" indicates that electrons are the majority carrier in the corresponding layers or regions, while "p" indicates that positive holes are the majority carrier. The symbol "+" attached to "n" or "p" indicates that the corresponding layers or regions have a higher impurity concentration than those without the symbol; the symbol "−" attached to "n" or "p" indicates that the corresponding layers or regions have a lower impurity concentration than those without the symbol.

Figure 1:
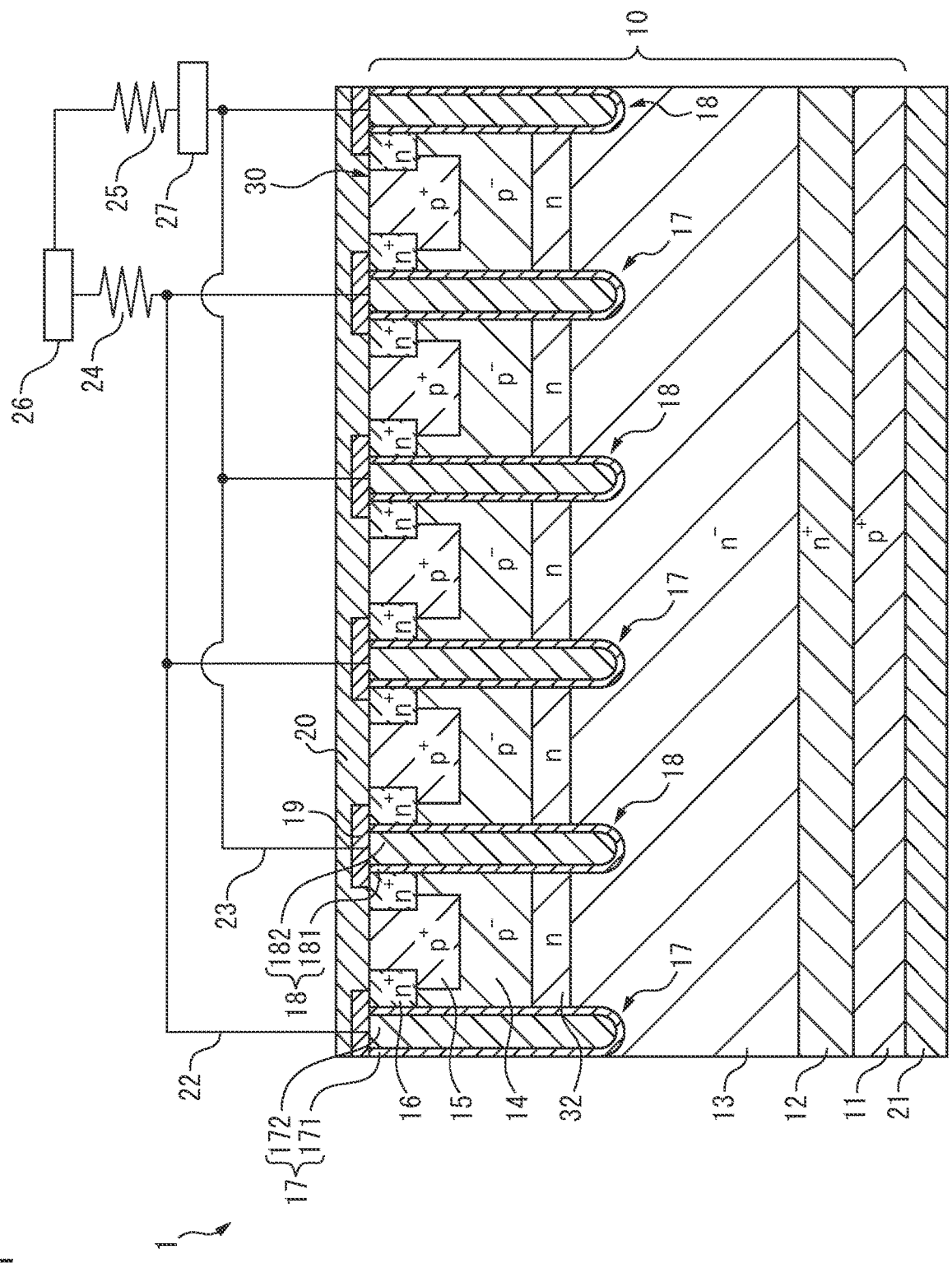
FIG. 1 is a cross-sectional view of a semiconductor device of the embodiment.
Figure 2:
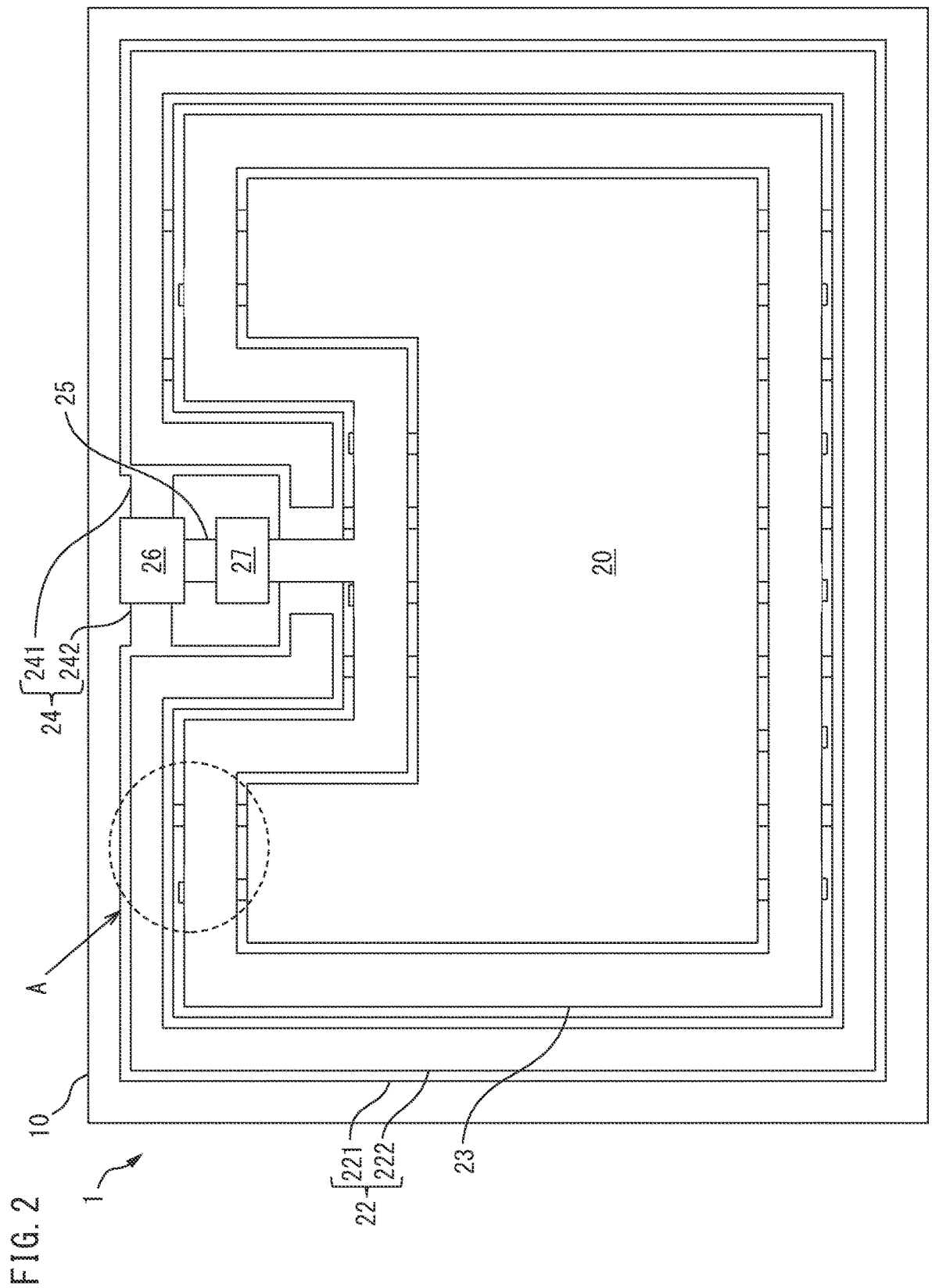
FIG. 2 is a plan view of the semiconductor device shown in FIG. 1.

FIGS. 1 and 2 are a cross-sectional view and a plan view of a semiconductor device 1 of the embodiment, respectively. Although FIGS. 1 and 2 show only an active region where a semiconductor element is formed, the semiconductor device 1 may include an edge terminal surrounding the active region. The active region is a region through which a current flows when the semiconductor device 1 operates; the edge terminal is a region for preventing the electric field from concentrating around the upper surface of the semiconductor device 1, and may have a structure of a guard ring (field limiting ring), field plate or RESURF (reduced surface field), for example.

The semiconductor device 1 is a device including silicon layers of the first and second conductive types, and more specifically, is a vertically structured IGBT including trench-shaped gate electrodes, but may be a device including silicon carbide layers of the first and second conductive types.

The semiconductor device 1 includes a semiconductor substrate 10. The semiconductor substrate 10 includes a collector layer 11, a buffer layer 12, a drift layer 13, accumulation regions 32, base regions 14, body regions 15, emitter regions 16, first gate trenches 17 and second gate trenches 18. The semiconductor device 1 further includes interlayer insulating films 19, an emitter electrode 20, a collector electrode 21, a first gate wiring 22, a second gate wiring 23, a first resistive section 24 having a first resistance, a second resistive section 25 having a second resistance, a gate pad 26 and a resistance measuring pad 27. The number and shape of first gate trenches 17 and second gate trenches 18 shown in FIGS. 1 and 2 are merely an example for simplicity.

The collector electrode 21 is disposed on the lower surface of the semiconductor substrate 10. The semiconductor substrate 10 is of the second conductive type (n-type). The collector layer 11 is a p-type silicon layer doped with an impurity, such as boron (B) or aluminum (Al), which imparts polarity of the first conductive type. The buffer layer 12 is an n-type silicon layer doped with an impurity, such as phosphorus (P), arsenic (As) or antimony (Sb), which imparts polarity of the second conductive type, and is disposed on the collector layer 11. The drift layer 13 is an n-type silicon layer doped with an impurity, such as phosphorus (P), arsenic (As) or antimony (Sb), which imparts polarity of the second conductive type, at a lower impurity concentration than the buffer layer 12, and is disposed on the buffer layer 12.

The accumulation regions 32 are n-type silicon layers doped with an impurity, such as phosphorus (P), arsenic (As) or antimony (Sb), which imparts polarity of the second conductive type, at a higher impurity concentration than the drift layer 13, and are disposed on the drift layer 13. The base regions 14 are p-type silicon layers doped with an impurity, such as boron (B) or aluminum (Al), which imparts polarity of the first conductive type, and are disposed on the accumulation regions 32, respectively, and in contact with both the first gate trenches 17 and second gate trenches 18. The body regions 15 are p-type silicon layers doped with an impurity, such as boron (B) or aluminum (Al), which imparts polarity of the first conductive type, at a higher impurity concentration than the base regions 14, and are disposed on the base regions 14, respectively. The emitter regions 16 are n-type silicon layers doped with an impurity, such as phosphorus (P), arsenic (As) or antimony (Sb), which imparts polarity of the second conductive type, at a higher impurity concentration than the drift layer 13. The emitter regions 16 are disposed in limited areas on the base regions 14 so that each of the first gate trenches 17 and second gate trenches 18 is sandwiched between the emitter regions 16 as viewed from above.

The first gate trenches 17 are formed on the surface of the semiconductor device 1, and each include a first gate insulating film 171 and a first gate electrode 172. The first gate insulating film 171 is an oxide film of $SiO_2$, for example, and is disposed on the side and bottom parts of the first gate trench 17 along the inner surfaces thereof. The first gate electrode 172 is made of polysilicon doped with an impurity, for example, and fills the inside of the first gate insulating film 171 of the first gate trench 17. The second gate trenches 18 each include a second gate insulating film 181 and a second gate electrode 182, similarly to the first gate trenches 17. Since the first gate trenches 17 alternate with the second gate trenches 18, the first gate electrodes 172 alternate with the second gate electrodes 182. In other words, one of the second gate electrodes 182 is disposed between adjacent first gate electrodes 172; one of the first gate electrodes 172 is disposed between adjacent second gate electrodes 182. Further, the second gate electrodes 182 each face a corresponding one of the first gate electrodes 172 via the base region 14, and the first gate electrodes 172 are disposed alternately with the second gate electrodes 182. Furthermore, the first gate electrode 172 is disposed at the base region 14 between two of the emitter regions 16, the first gate insulating film 171 being disposed between the first gate electrode 172 and two of the emitter regions 16; and the second gate electrode 182 is disposed between another two of the emitter regions 16, the second gate insulating film 181 being disposed between the second gate electrode 182 and the other two of the emitter regions 16.

The interlayer insulating films 19 are formed so as to cover the base regions 14, body regions 15, emitter regions 16, first gate trenches 17 and second gate trenches 18. The emitter electrode 20 has a rectangular shape with a recess, in a plane view of the semiconductor device 1, and is electrically connected to the body regions 15 and emitter regions 16 in openings 30 of the interlayer insulating films 19. The emitter electrode 20 is insulated from the first gate electrodes 172 and second gate electrodes 182 by the interlayer insulating films 19, first gate insulating films 171 and second gate insulating films 181. The collector electrode 21 is electrically connected to the collector layer 11.

The first gate wiring 22 is shaped into a rectangle frame having a recess, and surround the emitter electrode 20. The first gate wiring 22 is composed of a first conductive layer 221 made of polysilicon doped with an impurity, for example, and a second conductive layer 222 (metallic conductive layer) made of aluminum, copper or an alloy mainly composed of aluminum or copper, for example, and is electrically connected to the first gate electrodes 172. The first conductive layer 221 is electrically connected to the second conductive layer 222 via a contact hole 223. The second gate wiring 23 is shaped into a rectangle frame having a recess, and is disposed between the emitter electrode 20 and first gate wiring 22. The second gate wiring 23 is a metallic conductive layer made of aluminum, copper or an alloy mainly composed of aluminum or copper, for example, and is electrically connected to the second gate electrodes 182.

The first resistive section 24 and second resistive section 25 are made of polysilicon doped with an impurity, for example, and are disposed close to each other so as to face the recess of the emitter electrode 20. As shown in FIG. 2, the first resistive section 24 includes a first resistive layer 241 and a second resistive layer 242 which are connected in parallel to the first gate wiring 22 and gate pad 26. For example, if the first resistive layer 241, second resistive layer 242 and second resistive section 25 are formed under the same manufacturing conditions and have the same shape and size, the resistance of the first resistive section 24 is half of that of the second resistive section 25. The first resistive section 24 is electrically connected to the first gate electrodes 172 through the first gate wiring 22. The second resistive section 25 is electrically connected to the second gate electrodes 182 through the second gate wiring 23.

The first resistive section 24 and second resistive section 25 may be made of polysilicon doped with the same amount of impurities into different shapes having different lengths and widths, for example, so as to have different resistances, but may contain different amounts of impurities so as to have different resistances.

The ratio $R2/R1$ of the resistance (first resistance $R1$) of the first resistive section 24 to the resistance (second resistance $R2$) of the second resistive section 25 may be from 2 to 1000, and further may be from 10 to 100.

The gate pad 26 and resistance measuring pad 27 are metallic conductive layers made of aluminum, copper or an alloy mainly composed of aluminum, for example, and are disposed close to each other so as to face the recess of the emitter electrode 20 together with the first resistive section 24 and second resistive section 25. The gate pad 26 is electrically connected to the first gate wiring 22 via the first resistive section 24, and to the resistance measuring pad 27 via the second resistive section 25. The resistance measuring pad 27 is electrically connected to the second gate wiring 23 and second resistive section 25. Measuring the resistance between the gate pad 26 and resistance measuring pad 27 allows for knowing the actual resistance of the second resistive section 25 and for estimating the resistance of the first resistive section 24, based on design information, such as the shape of the first resistive section 24.

Figure 3:
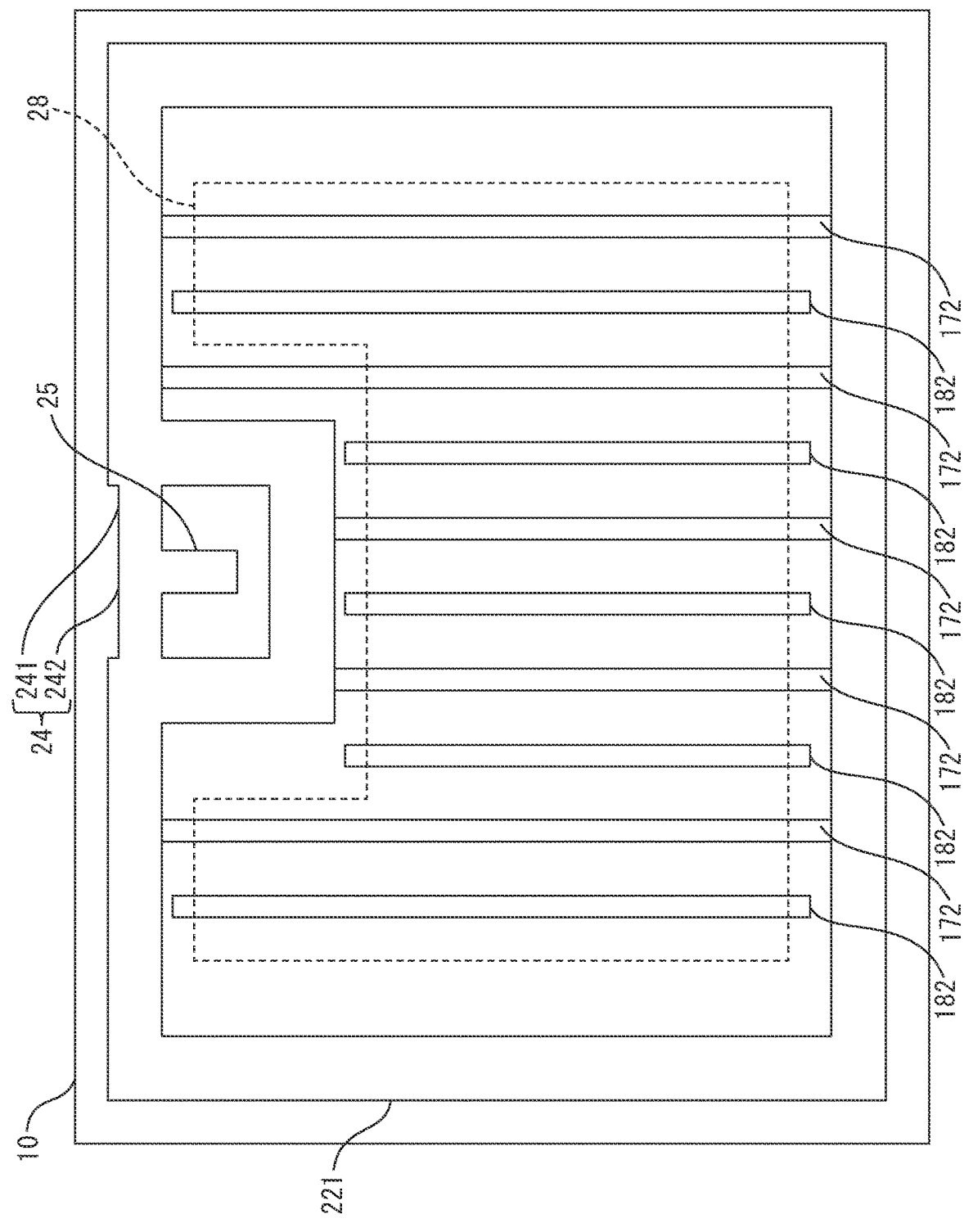
FIG. 3 is a plan view of the semiconductor device shown in FIG. 1, from which the metallic conductive layers are removed.
Figure 4:
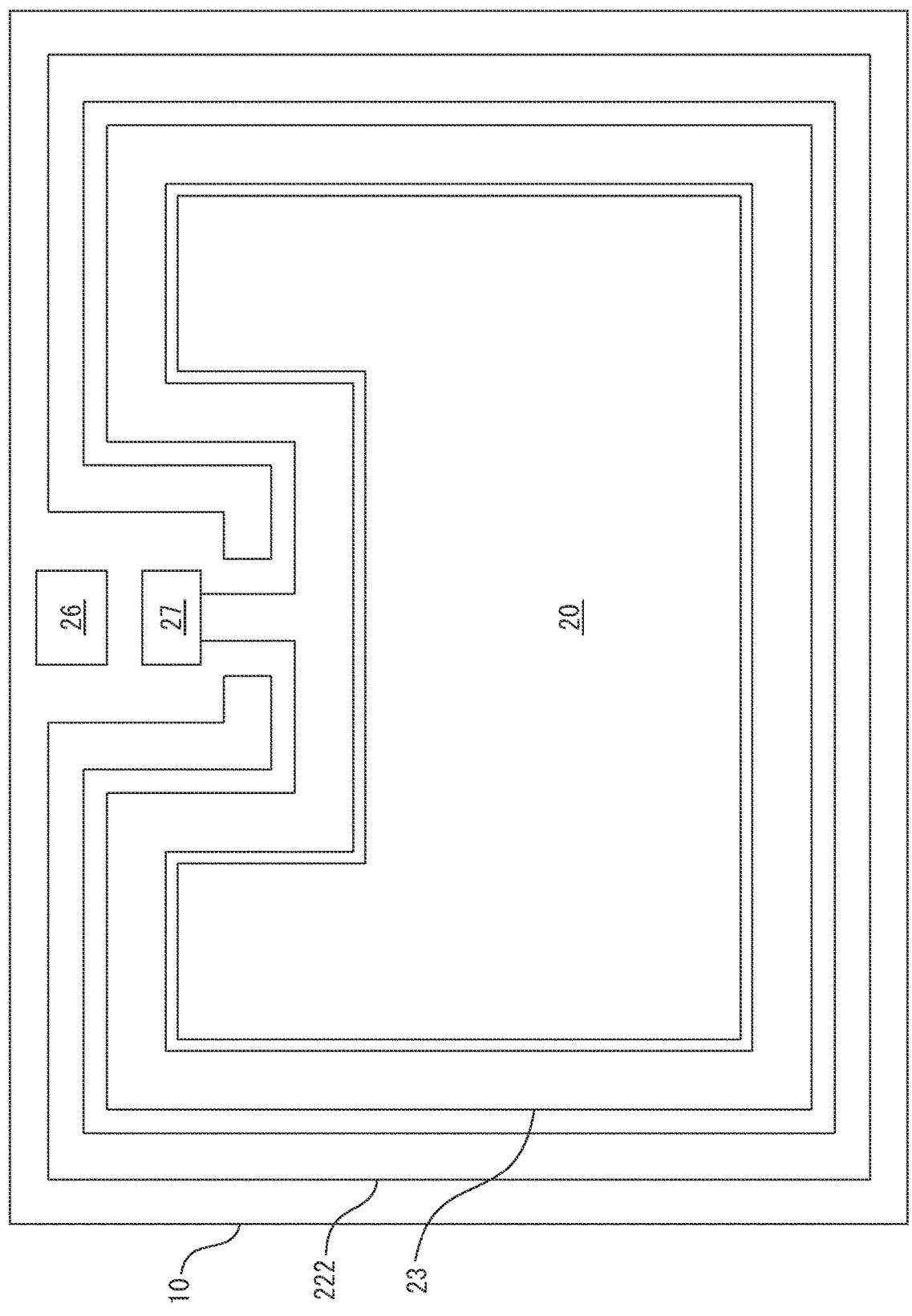
FIG. 4 is a plan view of the metallic conductive layers of the semiconductor device shown in FIG. 1.
Figure 5:
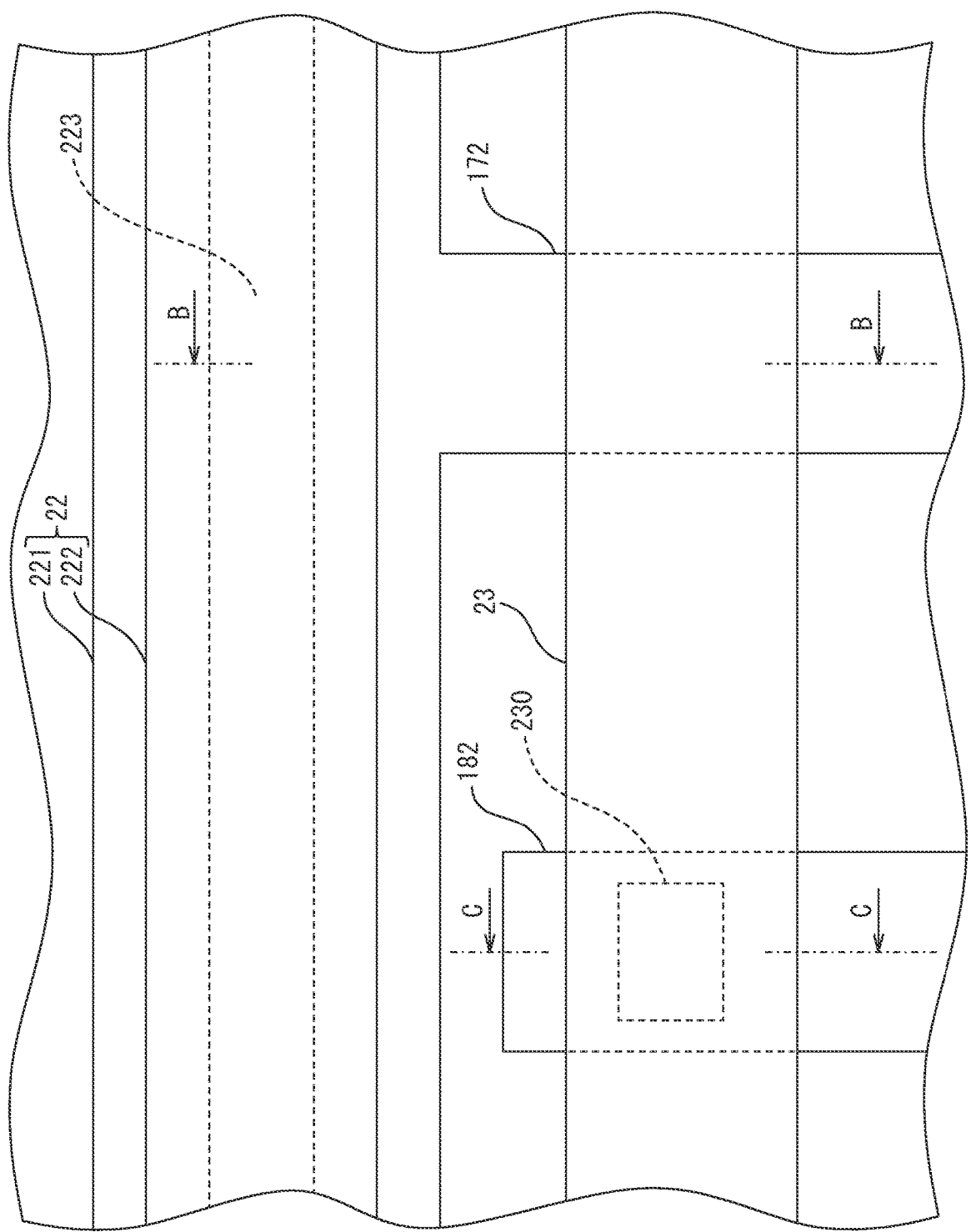
FIG. 5 is a partially enlarged plan view of the region indicated by arrow V in FIG. 2.
Figure 6:
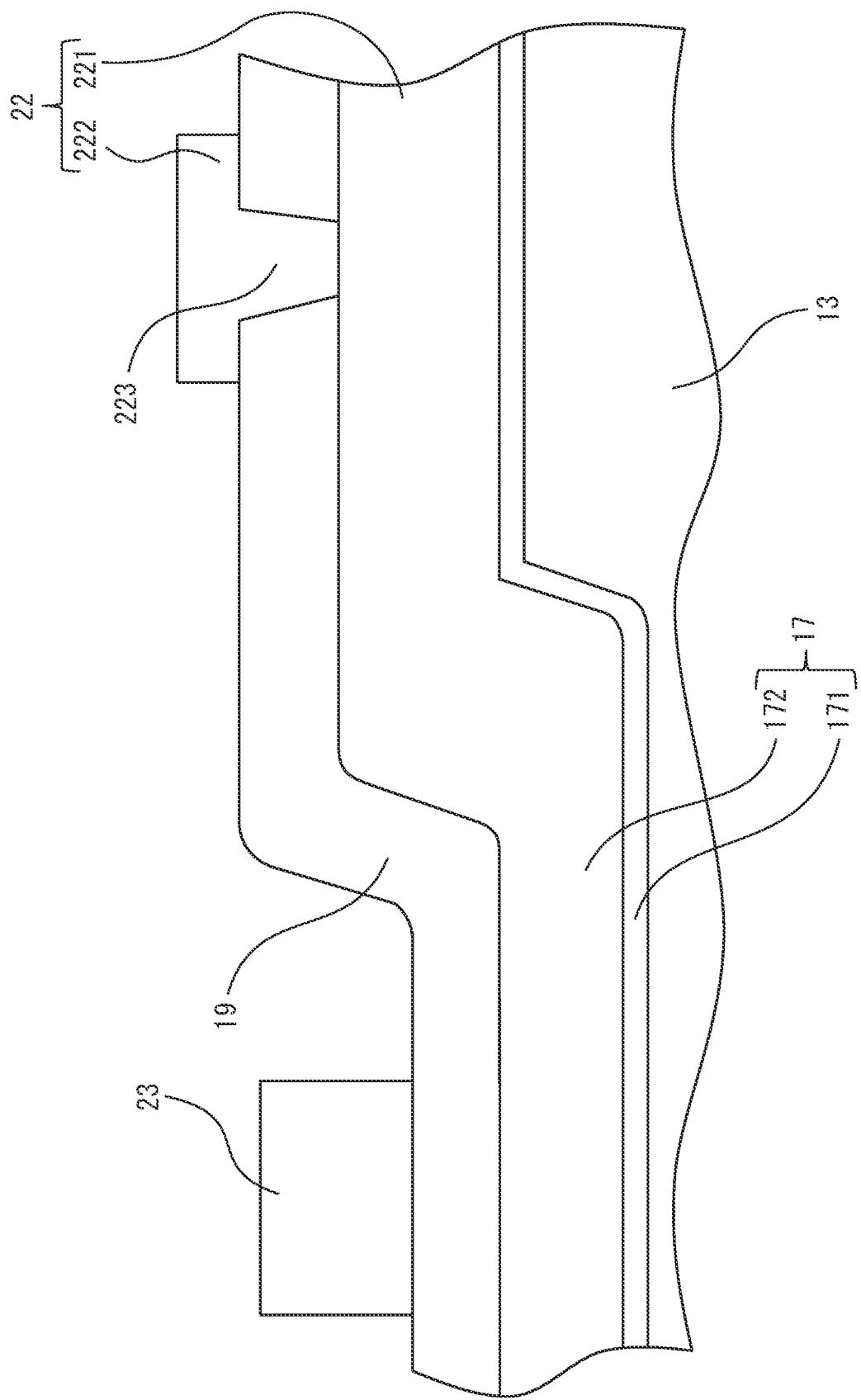
FIG. 6 shows a cross section taken along line VI-VI in FIG. 5.
Figure 7:
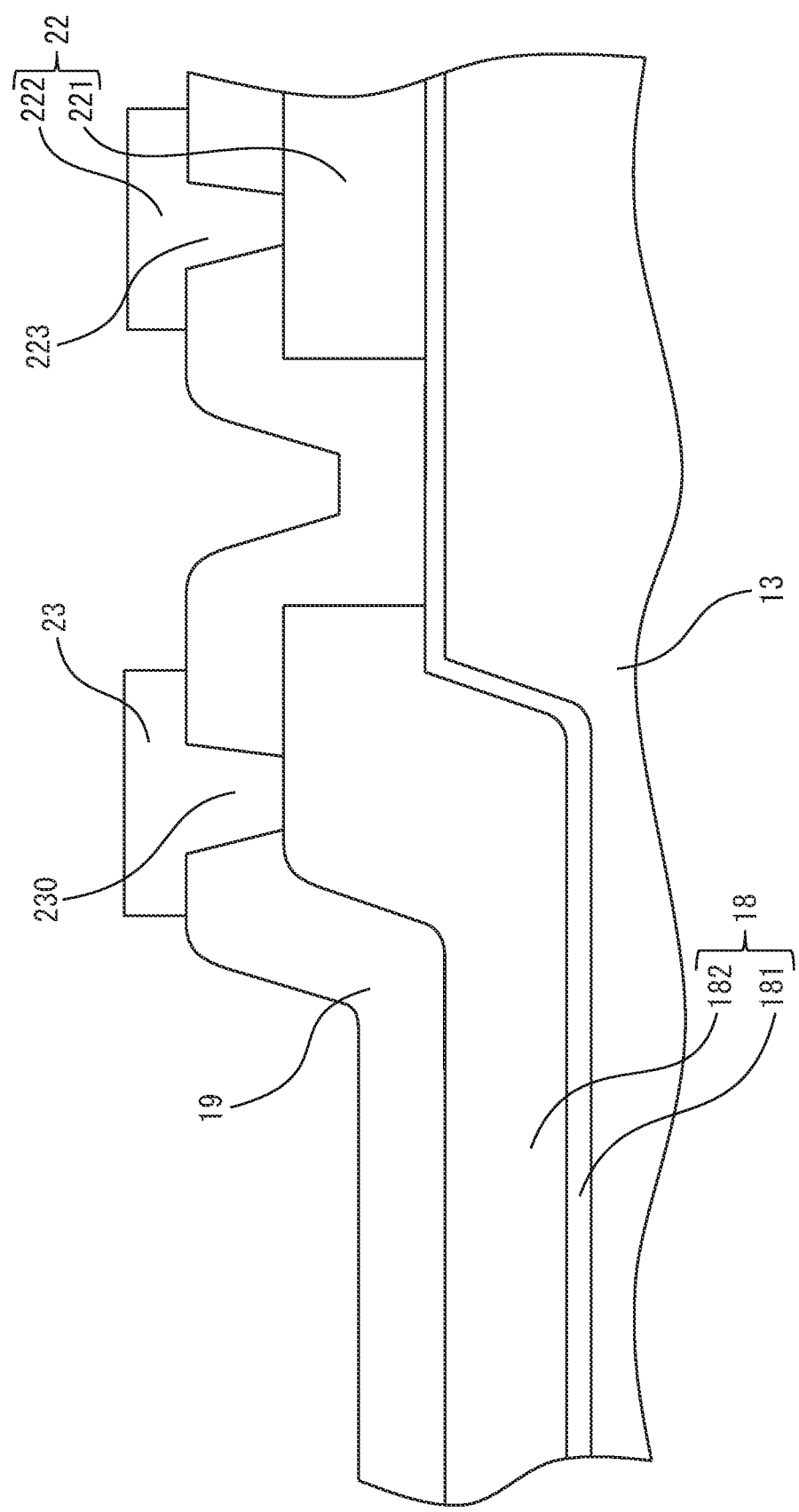
FIG. 7 shows a cross section taken along line VII-VII in FIG. 5.

FIG. 3 is a plan view of the semiconductor device 1, from which the metallic conductive layers are removed. FIG. 4 is a plan view of the metallic conductive layers of the semiconductor device 1. FIG. 5 is a partially enlarged plan view of the region indicated by arrow V in FIG. 2. FIGS. 6 and 7 show cross sections taken along lines VI-VI and VII-VII in FIG. 5, respectively.

The emitter electrode 20 covers a region 28 where the first gate trenches 17 and second gate trenches 18 are formed. The first gate wiring 22 surrounds the emitter electrode 20, and electrically connects the first gate electrodes 172 and first resistive section 24. The second gate wiring 23 surrounds the emitter electrode 20 inside the first gate wiring 22, and electrically connects the second gate electrodes 182 and second resistive section 25. The first gate electrodes 172 and second gate electrodes 182 are formed so that their edges protrude from the region 28. Both ends of each first gate electrode 172 are in contact with the first conductive layer 221 of the first gate wiring 22; thereby, the first gate electrodes 172 are electrically connected to the first conductive layer 221. The first gate electrodes 172 are electrically connected to the first resistive section 24 and gate pad 26 through the first gate wiring 22.

As shown in FIG. 5, both ends of each second gate electrode 182 protrude beyond the outer edges of the second gate wiring 23. Each second gate electrode 182 is electrically connected at both ends to the second gate wiring 23 via a contact hole 230. The second gate electrodes 182 are electrically connected to the second resistive section 25 and gate pad 26 through the second gate wiring 23.

The semiconductor device 1 is turned on in response to a turn-on voltage applied to the gate pad 26. On starting applying a turn-on voltage to the gate pad 26, the first gate electrodes 172 are supplied with a voltage through the first gate wiring 22 and first resistive section 24, while the second gate electrodes 182 are supplied with a voltage through the second gate wiring 23 and second resistive section 25.

Since the second resistive section 25 has a second resistance larger than a first resistance of the first resistive section 24, the voltage applied to the second gate electrodes 182 of the second gate trenches 18 increases slower than the voltage applied to the first gate electrodes 172 of the first gate trenches 17. When the voltage applied to the first gate electrodes 172 reaches a predetermined level, a hole current flows from the collector electrode 21, causing positive holes to be filled at the bottoms of the accumulation regions 32. However, when positive holes are filled on the interfaces between the accumulation regions 32 and the first and second gate insulating films 171 and 181, the voltage of the second gate electrodes 182 is substantially zero. Accordingly, the positive holes filled at the bottoms of the accumulation regions 32 are discharged from the emitter electrode 20 outside the semiconductor device 1 through the interfaces between the second gate insulating films 181 and accumulation regions 32. In the semiconductor device 1, this prevents the filled positive holes from raising the electric potential, and thus prevents a displacement current from flowing to the first gate electrodes 172. The rate of increase in electric potential of the first gate electrodes 172 is not affected by a displacement current and may be controlled only by a gate current flowing through the first resistive section 24, which provides favorable controllability.

When the voltage applied to the first gate electrodes 172 becomes larger than a threshold voltage, the first gate electrodes 172 create first n-type channel regions in the base regions 14. Next, when the voltage applied to the second gate electrodes 182 becomes larger than the threshold voltage, the second gate electrodes 182 create second n-type channel regions in the base regions 14. Then, electrons are supplied from the emitter regions 16 to the drift layer 13 through the first and second channel regions created in the base regions 14, while positive holes are supplied from the collector layer 11 to the drift layer 13, which causes the semiconductor device 1 to turn on.

Figure 8:
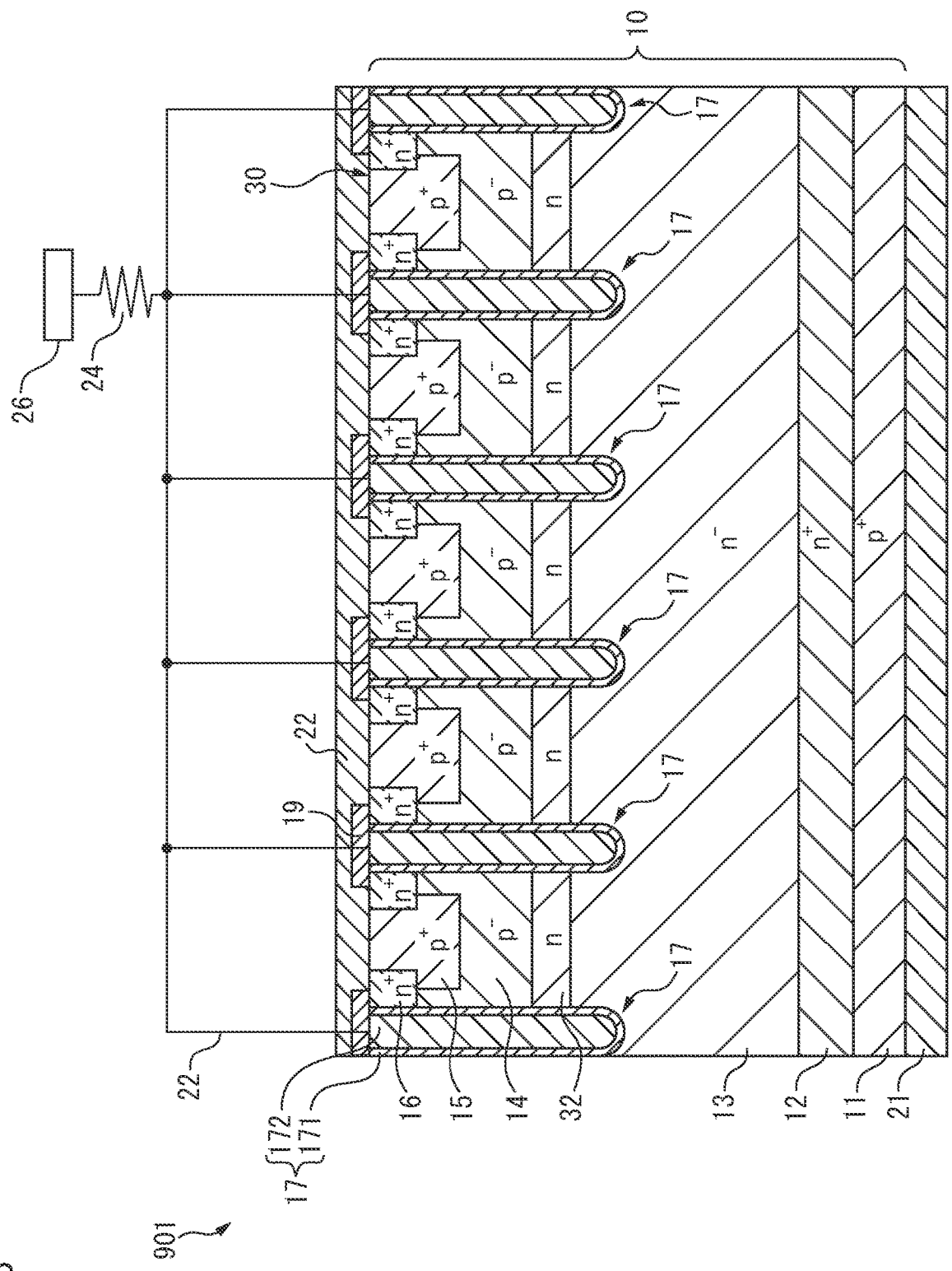
FIG. 8 is a cross-sectional view of a semiconductor device of a first comparative example.
Figure 9:
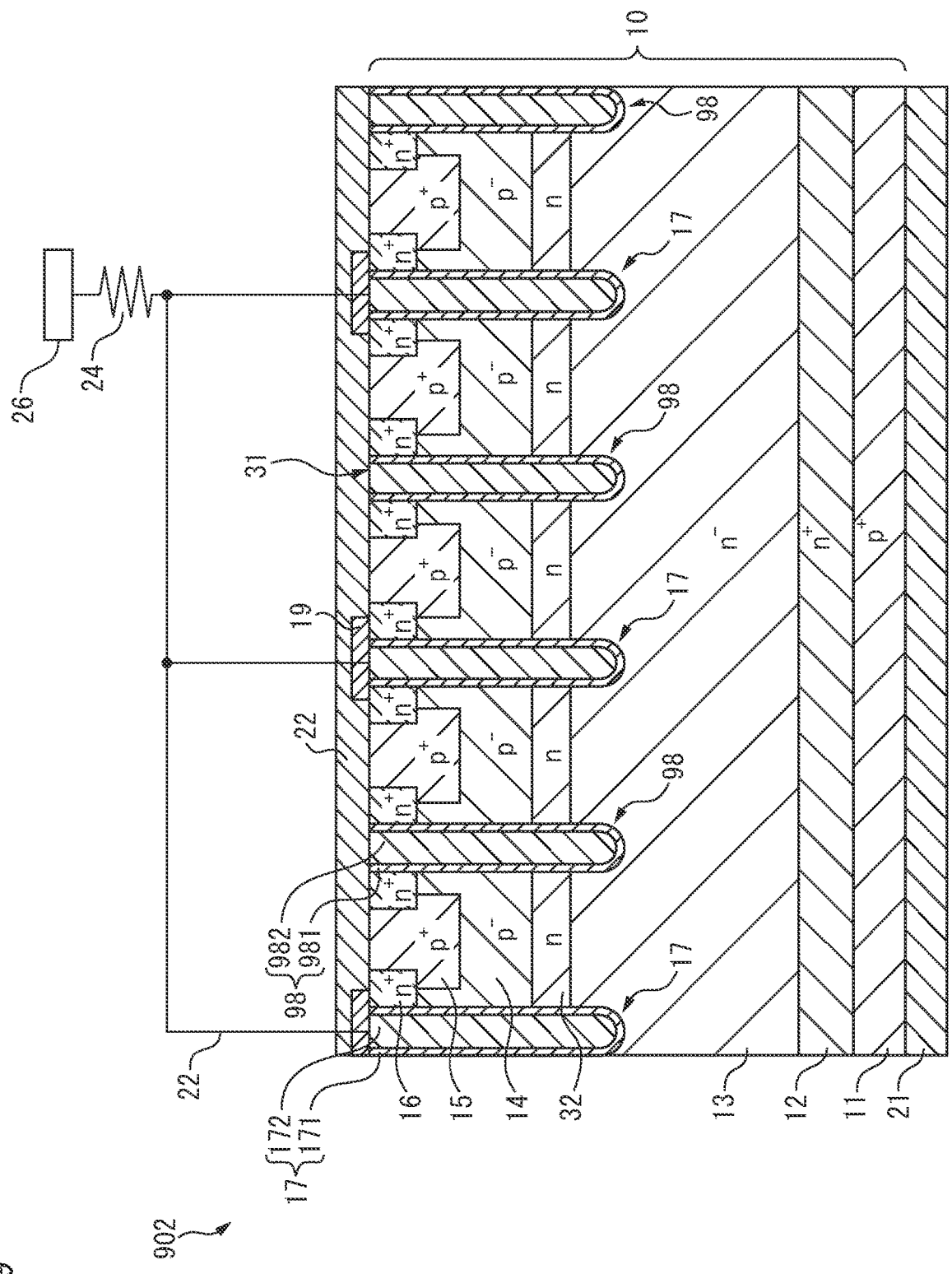
FIG. 9 is a cross-sectional view of a semiconductor device of a second comparative example.

FIGS. 8 and 9 are cross-sectional views of semiconductor devices 901 and 902 of first and second comparative examples, respectively.

The semiconductor device 901 does not include the second gate trenches 18 electrically connected to the gate pad 26 through the second gate wiring 23 and second resistive section 25, and differs from the semiconductor device 1 in this respect. Since the semiconductor device 901 is otherwise identical in structure and function to the semiconductor device 1, duplicated explanation is omitted.

The semiconductor device 902 includes second gate trenches 98 instead of the second gate trenches 18, and differs from the semiconductor device 1 in this respect. Since the semiconductor device 902 is otherwise identical in structure and function to the semiconductor device 1, duplicated explanation is omitted. The second gate trenches 98 each include a gate insulating film 981 and a gate electrode 982, and differ from the second gate trenches 18 in that the gate electrodes 982 are electrically connected not to the gate pad 26, but to the emitter electrode 20 in openings 31 of the interlayer insulating films 19.

Figure 10:
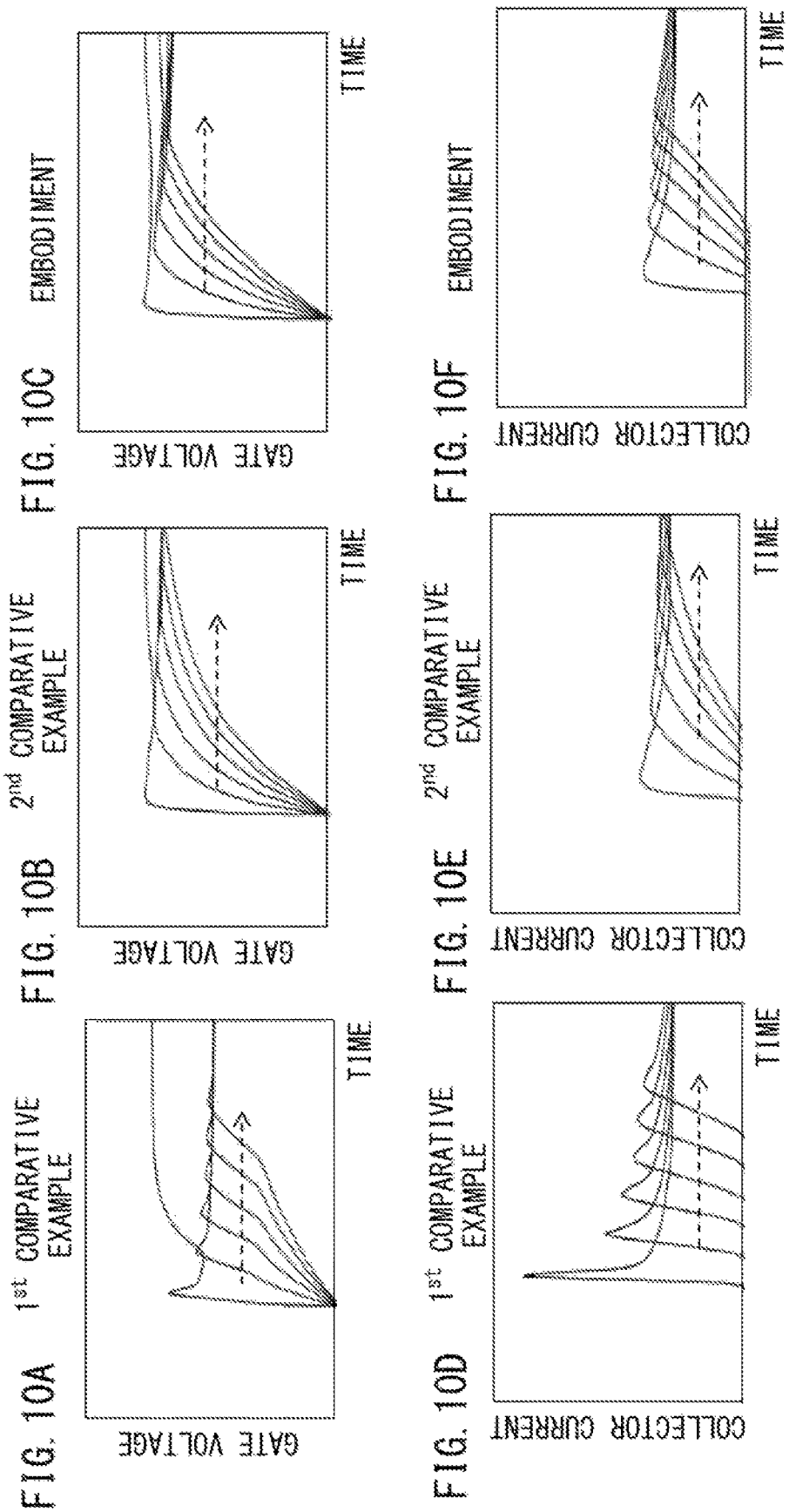
FIGS. 10A-10F are graphs showing turn-on characteristics of the semiconductor devices of the first and second comparative examples and the embodiment.

FIGS. 10A-10F are graphs showing turn-on characteristics of the semiconductor devices 901, 902 and 1 of the first and second comparative examples and the embodiment. FIGS. 10A-10C respectively show changes over time in gate voltages of the semiconductor devices 901, 902 and 1 of the first and second comparative examples and the embodiment. FIGS. 10D-10F respectively show changes over time in collector currents of the semiconductor devices 901, 902 and 1 of the first and second comparative examples and the embodiment. In FIGS. 10A-10C, the abscissas, ordinates and curves indicate time, gate voltages, and changes in gate voltages depending on the resistance of the first resistive section 24, respectively. In FIGS. 10D-10F, the abscissas, ordinates and curves indicate time, collector currents, and changes in collector currents depending on the resistance of the first resistive section 24, respectively. In FIG. 10A-10F, the resistance of the first resistive section 24 increases in the direction indicated by broken-line arrows.

In the semiconductor device 901, since the accumulation regions 32 are disposed between the first gate trenches 17, paths through which positive holes pass to the emitter electrode 20 are not formed; thus, positive holes injected from the collector layer 11 at the time of turn-on of the semiconductor device 901 remain at the bottoms of the accumulation regions 32. In the semiconductor device 901, this raises the electric potential to cause a displacement current to flow into the gate electrodes, and thus the gate voltage and collector current rise abruptly, even if the gate resistance is large; accordingly, the speed of turn-on is not favorably controlled.

In the semiconductor device 902, since the first gate trenches 17 alternate with the second gate trenches 98, positive holes injected from the collector layer 11 are discharged from the emitter electrode 20 outside the device, as in the semiconductor device 1. In the semiconductor device 902, this prevents the positive holes from raising the voltage and prevents the gate voltage and collector current from rising abruptly, which allows the turn-on speed to be favorably controlled.

In the semiconductor device 1, since the first gate trenches 17 alternate with the second gate trenches 18, positive holes injected from the collector layer 11 are discharged from the emitter electrode 20 outside the device. Since this prevents the positive holes from raising the voltage and prevents the gate voltage and collector current from rising abruptly, the semiconductor device 1 has favorable turn-on characteristics.

Figure 11:
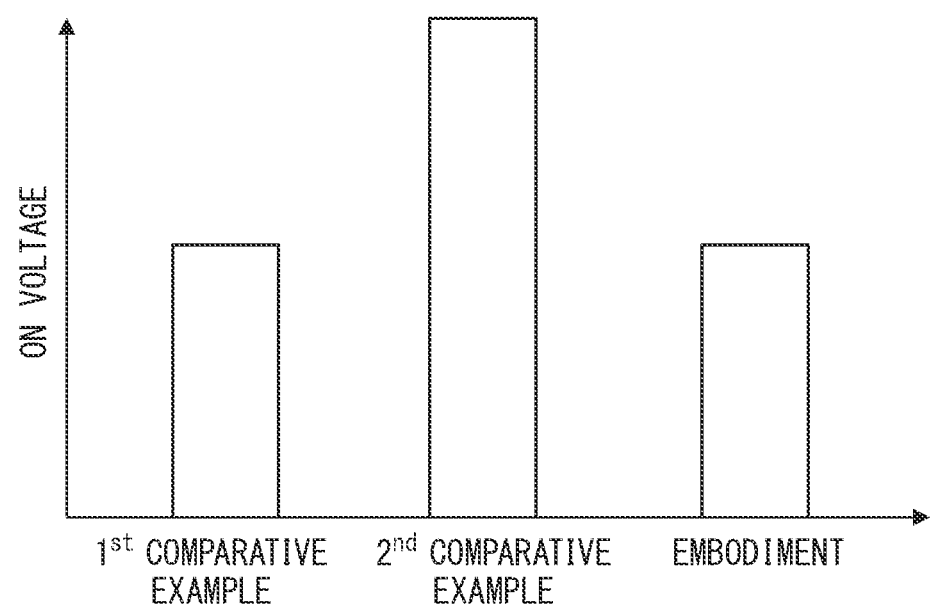
FIG. 11 is a graph showing ON voltages of the semiconductor devices of the first and second comparative examples and the embodiment.

FIG. 11 is a graph showing ON voltages of the semiconductor devices 901, 902 and 1 of the first and second comparative examples and the embodiment. The ordinate of FIG. 11 indicates voltages Vce applied between the collectors and emitters while the respective semiconductor devices are ON at a temperature of 125° C.

The ON voltage of the semiconductor device 902 of the second comparative example is approximately twice as large as that of the semiconductor device 901 of the first comparative example, which is not favorable. This is because in the semiconductor device 902, the second gate trenches 98 and first gate trenches 17 alternate with each other, only the latter of which have channel regions for providing electrical connection to the emitter electrode 20, and thus the number of current paths while being ON is one-half.

In the semiconductor device 1 of the embodiment, both the first gate trenches 17 and second gate trenches 18 are electrically connected to the gate pad 26, and thus have current paths after being turned on. Accordingly, as in the semiconductor device 901, the ON voltage of the semiconductor device 1 is approximately half of that of the semiconductor device 902, which is favorable.

The semiconductor device 1 has favorable turn-on characteristics similarly to the semiconductor device 902, and has favorable ON-voltage characteristics similarly to the semiconductor device 901.

In the semiconductor device 1, since the first gate wiring 22 and second gate wiring 23 surround the emitter electrode 20, each of the first gate electrodes 172 and second gate electrodes 182 are electrically connected at both ends to the first gate wiring 22 and second gate wiring 23. In the semiconductor device 1, the gate electrodes are electrically connected at both ends to the gate pad 26 through the respective gate wirings, and thus may be supplied with a voltage uniformly and faster than when each gate electrode is electrically connected only at one end to the corresponding gate wiring.

Figure 12:
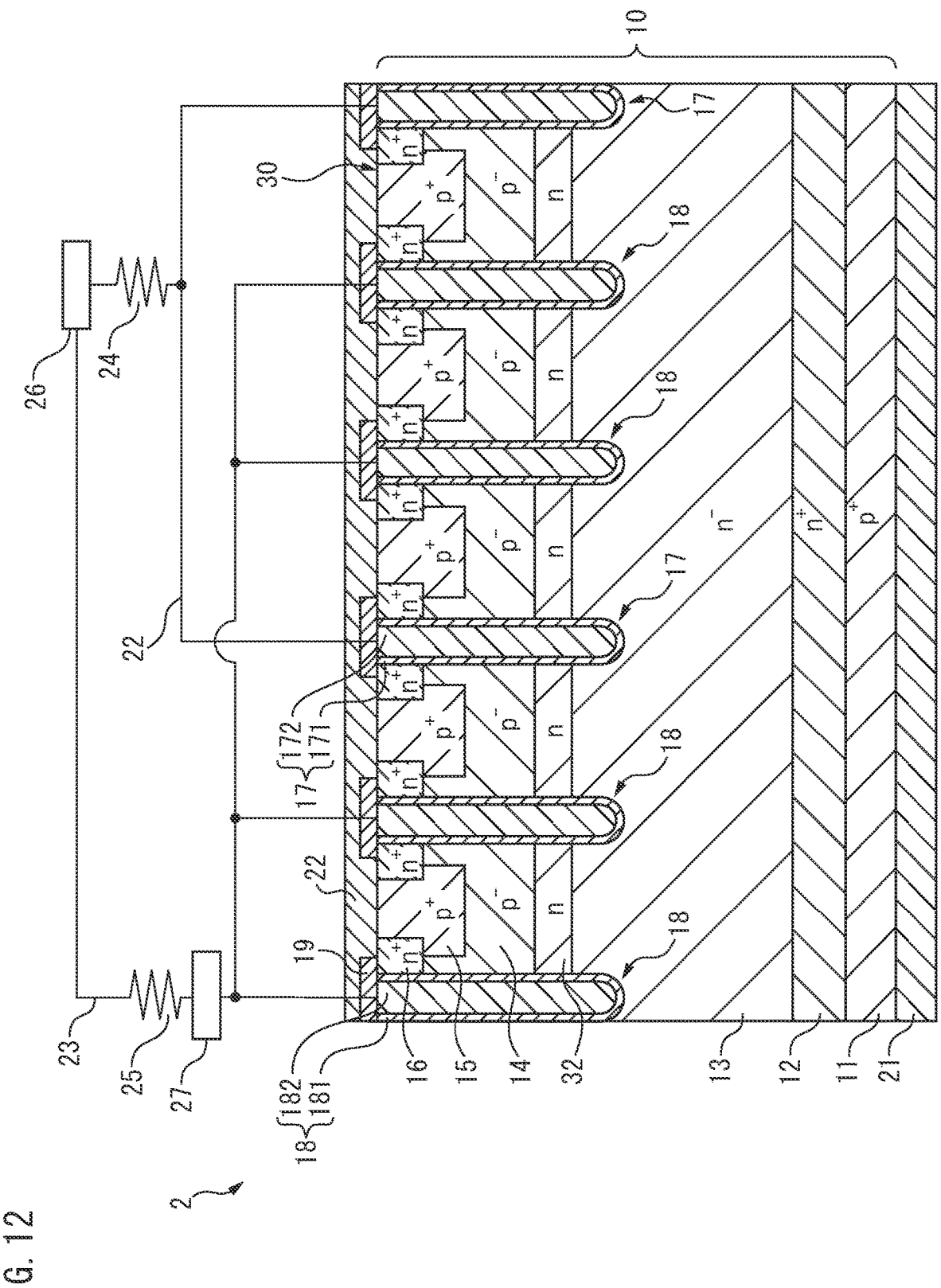
FIG. 12 is a cross-sectional view of a semiconductor device of a first modified example.
Figure 13:
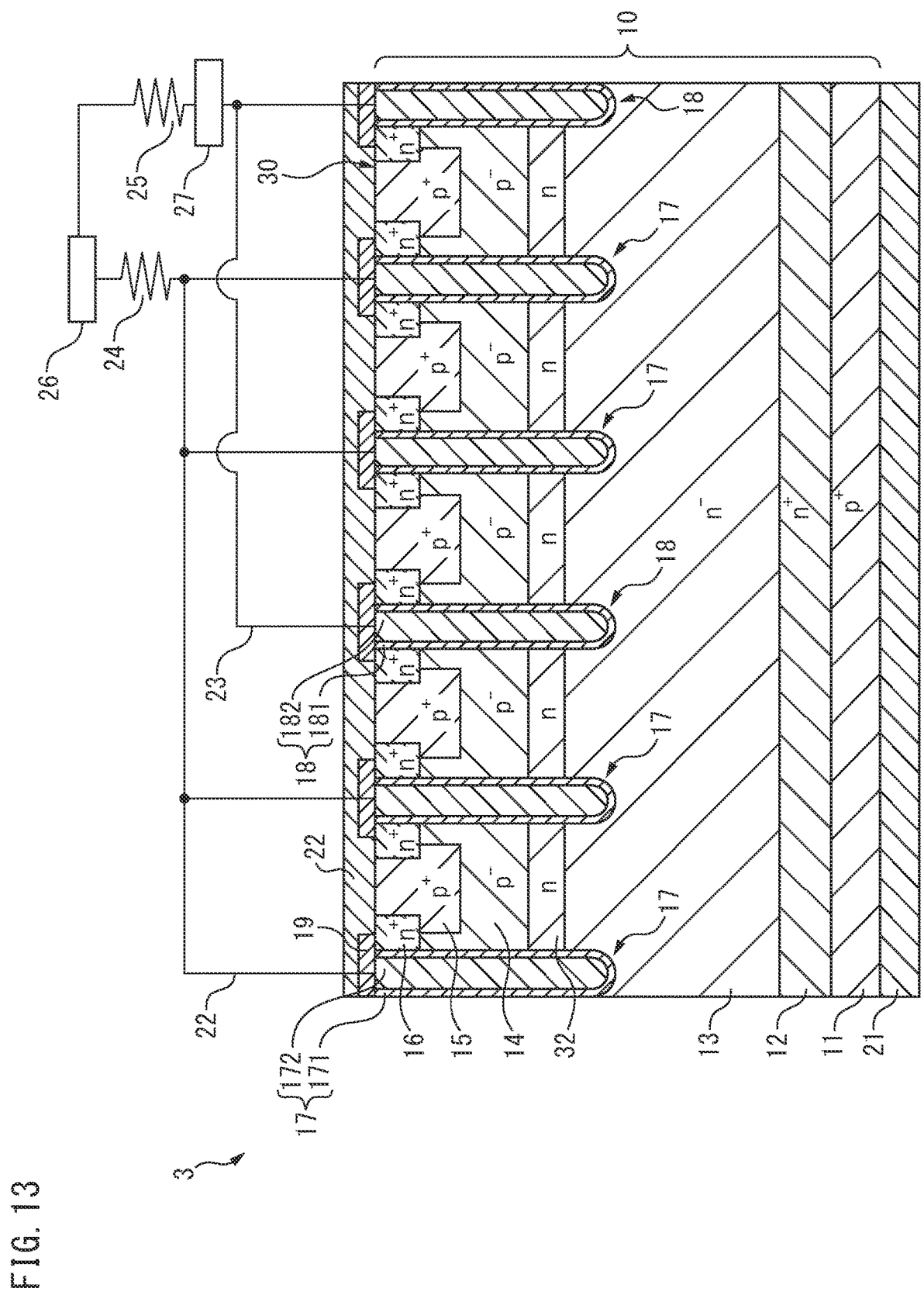
FIG. 13 is a cross-sectional view of a semiconductor device of a second modified example.

FIGS. 12 and 13 are cross-sectional views of semiconductor devices 2 and 3 of first and second modified examples, respectively.

The semiconductor devices 2 and 3 differ from the semiconductor device 1 of the embodiment in the arrangement of the first gate trenches 17 and second gate trenches 18. Since the semiconductor devices 2 and 3 are otherwise identical in structure and function to the semiconductor device 1, duplicated explanation is omitted.

In the semiconductor device 2, the second gate trenches 18 are twice as many as the first gate trenches 17. In the semiconductor device 2, each first gate trench 17 is disposed between two second gate trenches 18, while each second gate trench 18 is disposed between a first gate trench 17 and another second gate trench 18. In other words, two of the second gate trenches 18 are disposed between adjacent first gate trenches 17.

Since the second gate electrodes 182 electrically connected to the second resistive section 25 having a larger resistance are twice as many as the first gate electrodes 172 electrically connected to the first resistive section 24 having a smaller resistance, the semiconductor device 2 has better turn-on characteristics than the semiconductor device 1. In contrast, the ON voltage of the semiconductor device 2 is higher than that of the semiconductor device 1, since the second gate electrodes 182 are high in number. However, in the semiconductor device 2, since the first gate trenches 17 and second gate trenches 18 have current paths after being turned on, as in the semiconductor device 1, the ON voltage is approximately half of that of the semiconductor device 902 of the second comparative example; accordingly, the semiconductor device 2 has favorable ON-voltage characteristics.

In the semiconductor device 3, the first gate trenches 17 are twice as many as the second gate trenches 18. In the semiconductor device 3, each first gate trench 17 is disposed between another first gate trench 17 and a second gate trench 18, while each second gate trench 18 is disposed between two first gate trenches 17. In other words, two of the first gate trenches 17 are disposed between adjacent second gate trenches 18.

Since the first gate electrodes 172 electrically connected to the first resistive section 24 having a smaller resistance are twice as many as the second gate electrodes 182 electrically connected to the second resistive section 25 having a larger resistance, the ON voltage is lower, and thus the semiconductor device 3 has better ON-voltage characteristics than the semiconductor device 1. In contrast, in terms of the turn-on characteristics, the semiconductor device 3 is less favorable than the semiconductor device 1, since the first gate electrodes 172 are high in number. However, since positive holes injected from the collector layer 11 are discharged from the emitter electrode 20 outside the device, as in the semiconductor device 1, the semiconductor device 3 has better turn-on characteristics than the semiconductor device 901 of the first comparative example.

Figure 14:
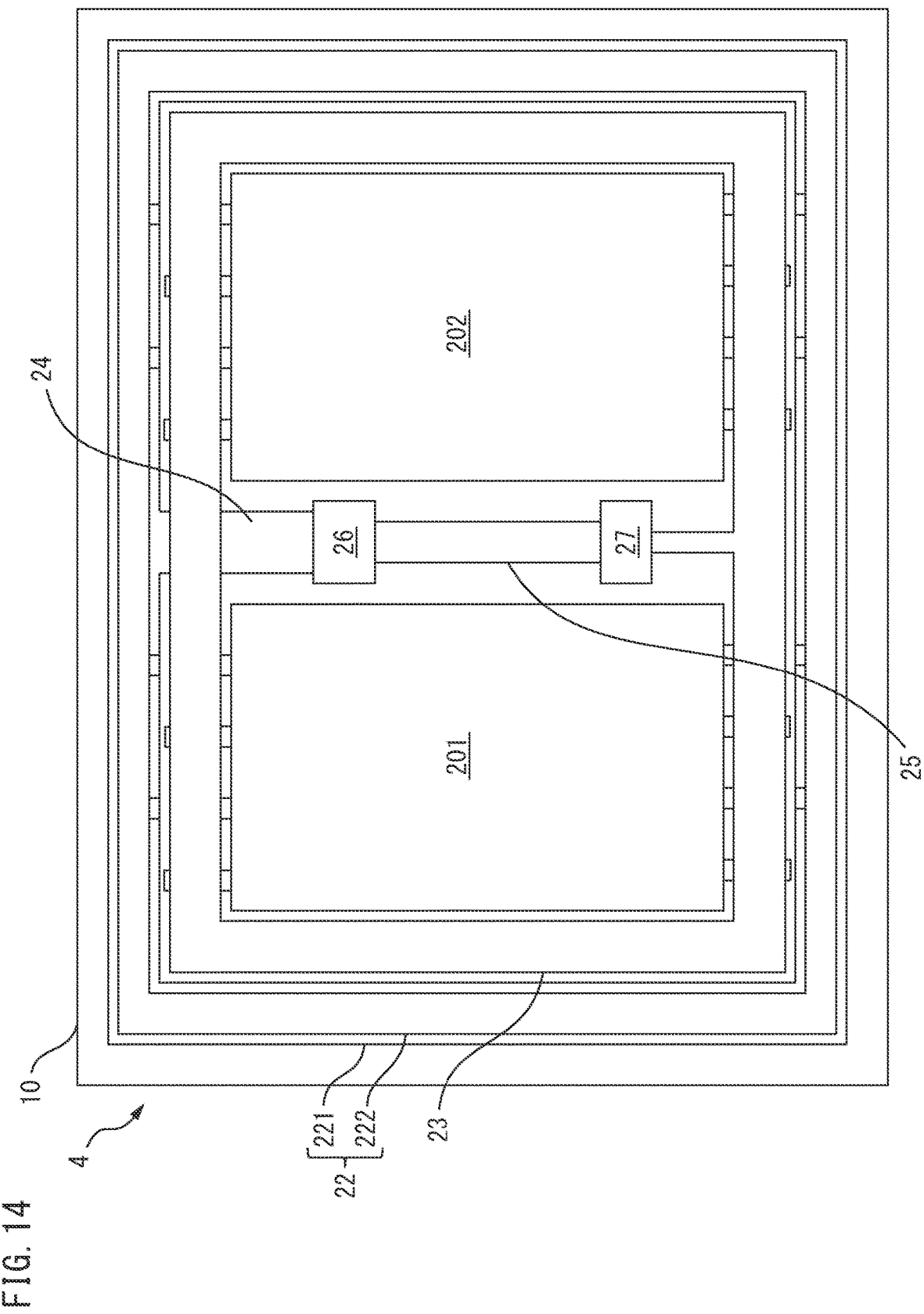
FIG. 14 is a plan view of a semiconductor device of a third modified example.

FIG. 14 is a plan view of a semiconductor device 4 of a third modified example.

The semiconductor device 4 includes a first emitter electrode 201 and a second emitter electrode 202 instead of the emitter electrode 20, and differs from the semiconductor device 1 of the embodiment in this respect. The semiconductor device 4 also differs from the semiconductor device 1 in the arrangement of the first resistive section 24, second resistive section 25, gate pad 26 and resistance measuring pad 27.

The first emitter electrode 201 and second emitter electrode 202 are electrically connected to emitter regions which are in contact with the first gate trenches 17 and second gate trenches 18 disposed below these emitter electrodes. Electrical connection to the first emitter electrode 201 and second emitter electrode 202 may be through a metallic conductive pattern or bonding wires.

The first resistive section 24, second resistive section 25, gate pad 26 and resistance measuring pad 27 are disposed between the first emitter electrode 201 and second emitter electrode 202.

Since the first gate trenches 17 alternate with the second gate trenches 18 as in the semiconductor device 1, the semiconductor device 4 has favorable turn-on characteristics and its ON voltage is low.

Although the first resistive section 24 and second resistive section 25 in the semiconductor devices 1-4 are separate elements, the second resistive section of the semiconductor devices of the embodiment may be formed as a combined resistance of the first resistive section and a third resistive section different from the first resistive section.

Figure 15:
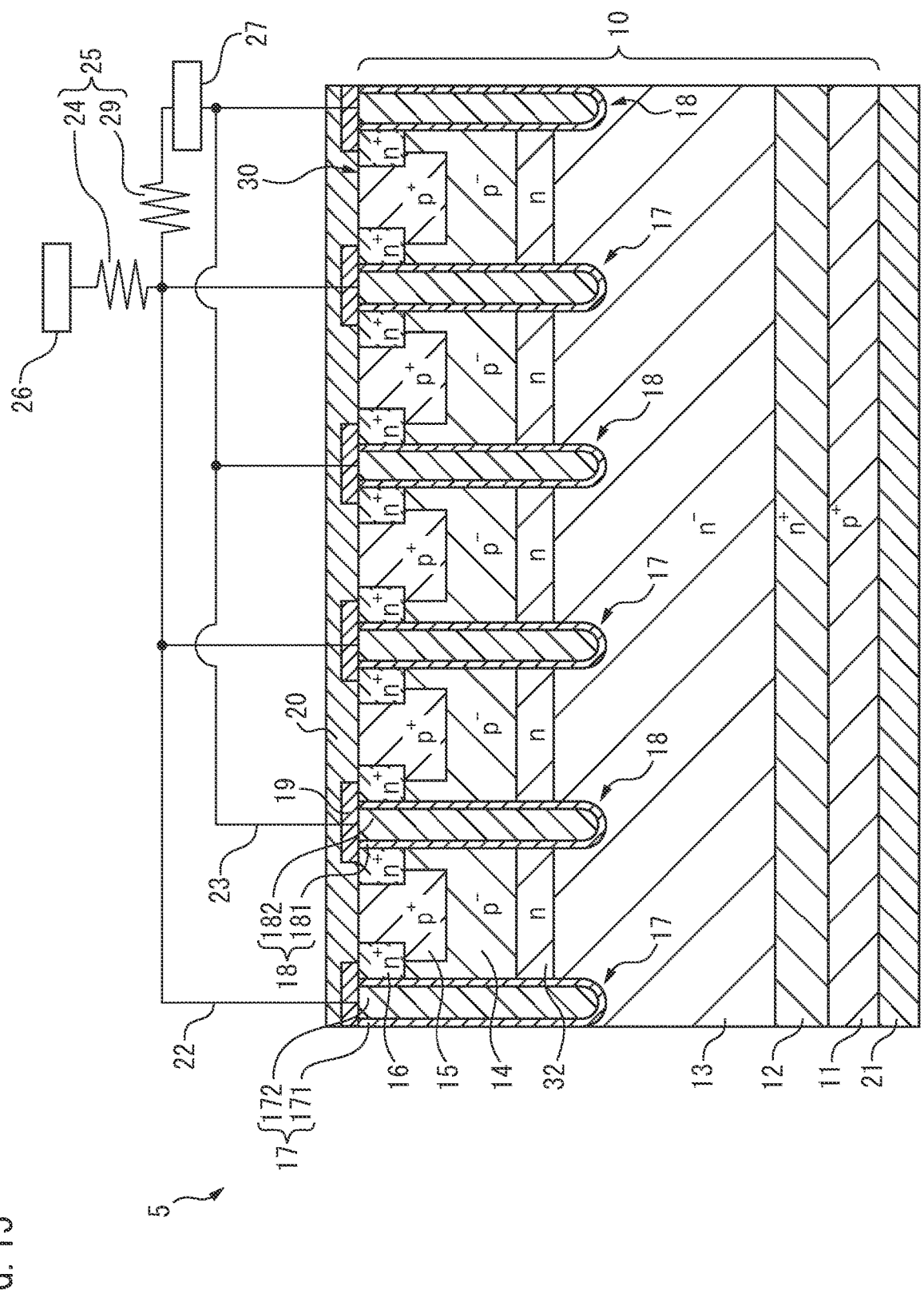
FIG. 15 is a cross-sectional view of a semiconductor device of a fourth modified example.

FIG. 15 is a cross-sectional view of a semiconductor device 5 of a fourth modified example.

The semiconductor device 5 includes a third resistive section 29, and differs from the semiconductor device 1 in this respect. Since the semiconductor device 5 is otherwise identical in structure and function to the semiconductor device 1, duplicated explanation is omitted.

One and the other ends of the third resistive section 29 are electrically connected to the first resistive section 24 and resistance measuring pad 27, respectively. The second resistive section 25 is a combined resistance of the first resistive section 24 and the third resistive section 29 different from the first resistive section 24. In other words, the second resistance is a combined resistance of the first resistance of the first resistive section and a third resistance of the third resistive section Since the first gate trenches 17 alternate with the second gate trenches 18 as in the semiconductor device 1, the semiconductor device 5 has favorable turn-on characteristics and its ON voltage is low.

The gate of each semiconductor device 1-5 is formed into a trench structure, i.e., the first gate trenches 17 and second gate trenches 18, but may have a planar structure.

The semiconductor devices 1-5 each include two gate electrode pads, i.e., the gate pad 26 and resistance measuring pad 27, but include only one gate electrode pad. In the semiconductor devices 1-5, the gate pad 26 is electrically connected to the first resistive section 24 and second resistive section 25, while the resistance measuring pad 27 is electrically connected to the second resistive section 25. However, in the semiconductor devices of the embodiment, the gate pad 26 may be electrically connected to the second resistive section 25, and the resistance measuring pad 27 may be electrically connected to the first resistive section 24 and second resistive section 25.

In the semiconductor devices 1-5, the first gate wiring 22 surrounds the emitter electrode 20, and the second gate wiring 23 surrounds the emitter electrode 20 inside the first gate wiring 22; however, the arrangement of the gate wirings in the semiconductor devices of the embodiment may be opposite. In the semiconductor devices of the embodiment, the second gate wiring may surround the emitter electrode 20, and the first gate wiring may surround the emitter electrode 20 inside the second gate wiring.

Although the invention has been described with respect to a specific embodiment for a complete and clear disclosure, the appended claims are not to be thus limited, but are to be construed as embodying all modifications and alternative constructions that may occur to one skilled in the art which fairly fall within the basic teaching herein set forth.

What is claimed is:

1. A semiconductor device, comprising:
   a collector layer of a first conductive type;
   a drift layer of a second conductive type, disposed over the collector layer;
   an accumulation region of the second conductive type, disposed on the drift layer;
   a base region of the first conductive type, disposed on the accumulation region;
   a plurality of emitter regions of the second conductive type, disposed in a surface layer of the base region;
   a first gate insulating film;
   a first gate electrode directly adjacent to the first gate insulating film, the first gate insulating film being directly adjacent to the emitter regions;
   a second gate insulating film;
   a second gate electrode facing the first gate electrode via the base region, and being directly adjacent to the second gate insulating film, the second gate insulating film being directly adjacent to the emitter regions;
   a first resistive section having a first resistance, and being electrically connected to the first gate electrode;
   a second resistive section having a second resistance greater than the first resistance and electrically connected to the second gate electrode; and
   a gate electrode pad electrically connected to the first and second resistive sections.

2. The semiconductor device according to claim 1, wherein
   the first gate electrode includes a plurality of first gate electrodes, and the second gate electrode includes a plurality of second gate electrodes, and
   one of the second gate electrodes is disposed between two adjacent first gate electrodes of the plurality of first gate electrodes.

3. The semiconductor device according to claim 2, wherein the second gate electrodes each face a corresponding one of the first gate electrodes via the base region.

4. The semiconductor device according to claim 2, wherein the first gate electrodes are disposed alternately with the second gate electrodes.

5. The semiconductor device according to claim 1, wherein
   the first gate electrode includes a plurality of first gate electrodes, and the second gate electrode includes a plurality of second gate electrodes, and
   one of the first gate electrodes is disposed between two adjacent second gate electrodes of the plurality of second gate electrodes.

6. The semiconductor device according to claim 5, wherein the second gate electrodes each face a corresponding one of the first gate electrodes via the base region.

7. The semiconductor device according to claim 1, further comprising:
   an emitter electrode electrically connected to the emitter regions;
   a first gate wiring surrounding the emitter electrode, and electrically connecting the first gate electrode and the first resistive section; and
   a second gate wiring surrounding the emitter electrode, and electrically connecting the second gate electrode and the second resistive section.

8. The semiconductor device according to claim 7, wherein the gate electrode pad includes a first gate electrode pad electrically connected to the first and second gate wirings via the first and second resistive sections, respectively.

9. The semiconductor device according to claim 8, wherein the gate electrode pad further includes a second gate electrode pad disposed between the second resistive section and the second gate wiring.

10. The semiconductor device according to claim 7, wherein
    the emitter electrode has a rectangular shape with a recess, in a plan view of the semiconductor device, and
    the first and second resistive sections face the recess, in the plan view.

11. The semiconductor device according to claim 7, wherein
    the emitter electrode includes a first emitter electrode, and a second emitter electrode apart from the first emitter electrode, and
    the first and second resistive sections are disposed between the first and second emitter electrodes.

12. The semiconductor device according to claim 1, further comprising a third resistive section that is different from the first resistive section, wherein
    the second resistance is a combined resistance of the first resistance of the first resistive section and a third resistance of the third resistive section.

13. The semiconductor device according to claim 1, wherein
    the first gate electrode is disposed at the base region between two of the emitter regions, the first gate insulating film being disposed between the first gate electrode and two of the emitter regions; and
    the second gate electrode is disposed between another two of the emitter regions, the second gate insulating film being disposed between the second gate electrode and the other two of the emitter regions.

14. The semiconductor device according to claim 1, further including
    a plurality of first gate trenches and a plurality of second gate trenches, each first gate trench being disposed adjacent to at least one of the plurality of second gate trenches, wherein
    the first gate electrode is disposed in plurality, and each first gate electrode is included a respective one of the plurality of first gate trenches,
    the second gate electrode is disposed in plurality, and each second gate electrode is included a respective one of the plurality of second gate trenches, and
    a total number of the first gate trenches is twice as many as a total number of the second gate trenches.

15. The semiconductor device according to claim 1, further comprising:

a first emitter electrode and a second emitter electrode electrically connected to the emitter regions.

* * * * *